United States Patent
Noguchi et al.

(10) Patent No.: US 9,059,406 B2
(45) Date of Patent: *Jun. 16, 2015

(54) PZT-BASED FERROELECTRIC THIN FILM AND METHOD OF MANUFACTURING THE SAME

(71) Applicant: MITSUBISHI MATERIALS CORPORATION, Tokyo (JP)

(72) Inventors: Takashi Noguchi, Naka (JP); Toshihiro Doi, Naka (JP); Hideaki Sakurai, Naka (JP); Toshiaki Watanabe, Sanda (JP); Nobuyuki Soyama, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 163 days.

This patent is subject to a terminal disclaimer.

(21) Appl. No.: 13/831,041

(22) Filed: Mar. 14, 2013

(65) Prior Publication Data

US 2013/0258549 A1 Oct. 3, 2013

(30) Foreign Application Priority Data

Mar. 30, 2012 (JP) ................ 2012-079197

(51) Int. Cl.
*H01G 4/06* (2006.01)
*H01L 41/187* (2006.01)
*H01G 4/12* (2006.01)
*H01L 49/02* (2006.01)
*H01L 37/02* (2006.01)
(Continued)

(52) U.S. Cl.
CPC ..... *H01L 41/1876* (2013.01); *Y10T 428/24975* (2015.01); *Y10T 428/265* (2015.01); *H01G 4/1245* (2013.01); *H01L 28/56* (2013.01); *H01L 37/025* (2013.01); *H01L 41/0815* (2013.01); *H03H 9/02031* (2013.01); *H01G 4/018* (2013.01); *H01L 41/318* (2013.01); *H01L 41/319* (2013.01); *H01L 29/78391* (2014.09)

(58) Field of Classification Search
USPC .............. 361/311, 303–305, 312–313, 321.1, 361/321.2, 301.4
See application file for complete search history.

(56) References Cited

U.S. PATENT DOCUMENTS

2013/0257228 A1* 10/2013 Noguchi et al. .............. 310/357

FOREIGN PATENT DOCUMENTS

EP 2525391 A2 11/2012
JP 10-335596 A 12/1998
(Continued)

OTHER PUBLICATIONS

European Search Report dated Dec. 2, 2014, issued for the corresponding European patent application No. 13160999 2.

*Primary Examiner* — Nguyen T Ha
(74) *Attorney, Agent, or Firm* — Locke Lord LLP; James E. Armstrong, IV (57) ABSTRACT

A PZT-based ferroelectric thin film formed on a lower electrode of a substrate having the lower electrode in which the crystal plane is oriented in a (111) axis direction, having an orientation controlling layer which is formed on the lower electrode and has a layer thickness in which a crystal orientation is controlled in a (111) plane preferentially in a range of 45 nm to 270 nm, and a film thickness adjusting layer which is formed on the orientation controlling layer and has the same crystal orientation as the crystal orientation of the orientation controlling layer, in which an interface is formed between the orientation controlling layer and the film thickness adjusting layer.

12 Claims, 2 Drawing Sheets

10 SUBSTRATE
11 LOWER ELECTRODE
12 ORIENTATION CONTROLLING LAYER
13 FILM THICKNESS ADJUSTING LAYER
14 INTERFACE (51) Int. Cl.
  *H01L 41/08*   (2006.01)
  *H03H 9/02*   (2006.01)
  *H01G 4/018*   (2006.01)
  *H01L 41/318*   (2013.01)
  *H01L 41/319*   (2013.01)
  *H01L 29/78*   (2006.01)

(56) References Cited

FOREIGN PATENT DOCUMENTS

| | | |
|---|---|---|
| JP | 2004-292218 A | 10/2004 |
| JP | 2009-170695 A | 7/2009 |
| JP | 2012-009800 A | 1/2012 |

* cited by examiner

FIG. 1

10 SUBSTRATE
11 LOWER ELECTRODE
12 ORIENTATION CONTROLLING LAYER
13 FILM THICKNESS ADJUSTING LAYER
14 INTERFACE

FIG. 2

15 GRAIN DIAMETER CONTROLLING LAYER

PZT-BASED FERROELECTRIC THIN FILM AND METHOD OF MANUFACTURING THE SAME

TECHNICAL FIELD

The present invention relates to a PZT-based ferroelectric thin film applicable to electronic components, such as capacitors and piezoelectric elements, and a method of manufacturing the same, and, particularly, relates to a PZT-based ferroelectric thin film having improved lifetime reliability and a method of manufacturing the same.

BACKGROUND ART

In recent years, due to a demand for additional reduction in the size of electronic components and electronic devices, efforts have been made to research, develop techniques and put techniques into practical use for applying a ferroelectric thin film to electronic components or electronic devices formed by applying a dielectric body, such as capacitors and piezoelectric elements. Among ferroelectric thin films, a ferroelectric thin film having the (111) plane preferentially crystal-oriented has versatility, and has, particularly, a characteristic of a high insulating pressure resistance as well as a basic dielectric characteristic. Meanwhile, lead zirconate titanate (PZT) is a ferroelectric body having a perovskite structure and exhibiting excellent dielectric characteristics. When the PZT is used as a dielectric thin film material, it is possible to obtain excellent electronic components and electric devices.

Therefore, a technique for forming a PZT-based ferroelectric thin film for electronic components by applying chemical solution deposition (CSD), in which film-forming processes are low in cost, and a sol-gel liquid which produces a uniform film composition in a substrate is used, is put into practical use. Additionally, since the ferroelectric thin film having the (111) plane preferentially crystal-oriented is used in a variety of fields and environments due to its versatility, there is a demand for improvement for higher lifetime reliability.

Therefore, thus far, a method for improving the lifetime reliability by adding elements such as La and Nb to PZT has been proposed (for example, refer to Patent Documents 1 and 2). In addition, with attention on the film structure of a PZT-based ferroelectric thin film, a method for improving the lifetime reliability by employing a structure in which the microstructure of the PZT-based ferroelectric thin film is controlled is proposed (for example, refer to Patent Document 3).

RELATED ART DOCUMENT

Patent Document

[Patent Document 1] Japanese Unexamined Patent Application Publication No. 10-335596
[Patent Document 2] Japanese Unexamined Patent Application Publication No. 2009-170695
[Patent Document 3] Japanese Unexamined Patent Application Publication No. 2012-9800 (Claim 1 and paragraph [0007])

DISCLOSURE OF THE INVENTION

Problem that the Invention is to Solve

However, according to the methods for improving the lifetime reliability of a PZT-based ferroelectric thin film proposed in Patent Documents 1 to 3, while it is possible to extend the lifetime of the electronic components and the electronic devices to a certain extent, it is necessary to meet a demand for ensuring higher lifetime reliability while maintaining the same dielectric characteristics as a PZT-based ferroelectric thin film of the related art. Therefore, as a result of intensive studies, the present inventors achieved the invention.

An object of the invention is to provide a PZT-based ferroelectric thin film having higher lifetime reliability while maintaining the same dielectric characteristics as a PZT-based ferroelectric thin film of the related art, and a method of manufacturing the same.

Means for Solving the Problems

Figure 1:
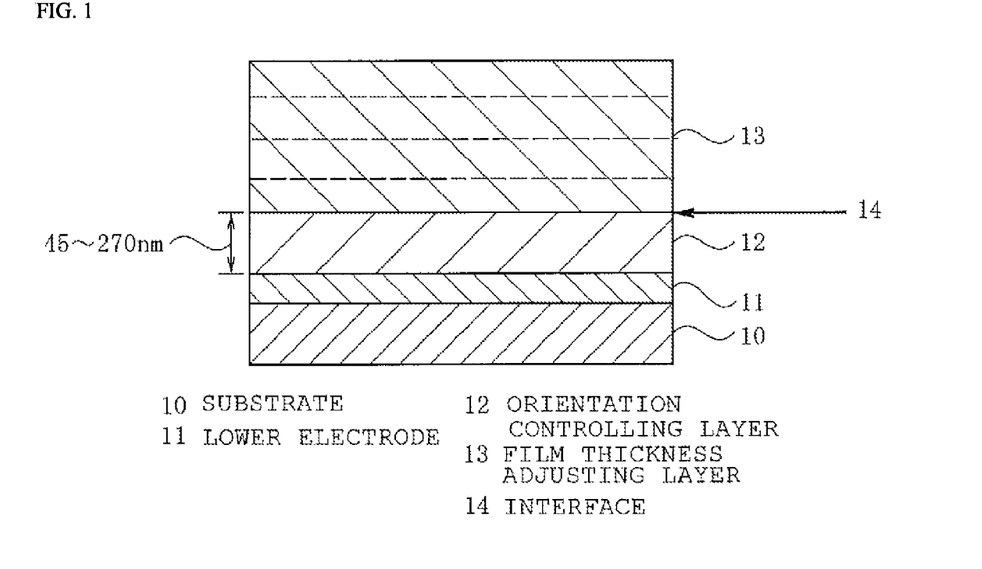
FIG. 1 is a schematic view of the cross-sectional structure of the PZT-based ferroelectric thin film, the substrate, and the lower electrode of the invention.

A first aspect of the invention is, as shown in FIG. 1, a PZT-based ferroelectric thin film formed on a lower electrode 11 of a substrate 10 having the lower electrode 11 in which the crystal plane is oriented in a (111) axis direction, having an orientation controlling layer 12 which is formed on the lower electrode 11 and has a layer thickness in which a crystal orientation is controlled in a (111) plane preferentially in a range of 45 nm to 270 nm, and a film thickness adjusting layer 13 which is formed on the orientation controlling layer 12 and has the same crystal orientation as the crystal orientation of the orientation controlling layer 12, in which an interface 14 is present between the orientation controlling layer 12 and the film thickness adjusting layer 13.

A second aspect of the invention is an invention based on the first aspect, in which, furthermore, the average value of the maximum unidirectional diameter of crystal grains present in the orientation controlling layer 12 is in a range of 200 nm to 5000 nm.

A third aspect of the invention is an invention based on the first aspect, in which, furthermore, the average value of the maximum unidirectional diameter of crystal grains present in the orientation controlling layer 12 is in a range of less than 200 nm.

Figure 2:
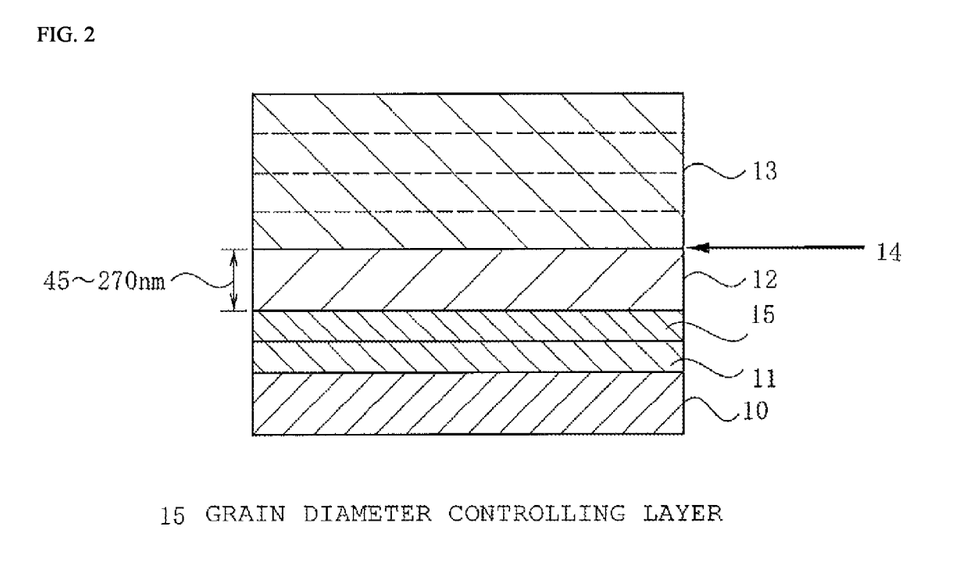
FIG. 2 is a schematic view of the cross-sectional structure of another PZT-based ferroelectric thin film, the substrate, and the lower electrode of the invention.

A fourth aspect of the invention is an invention based on the third aspect, in which the orientation controlling layer 12 is formed on the lower electrode 11 through a grain diameter controlling layer 15.

A fifth aspect of the invention is an invention based on the first to fourth aspects, in which the film thickness of a PZT-based ferroelectric thin film is in a range of 100 nm to 5000 nm.

A sixth aspect of the invention is an invention based on the third aspect, in which the PZT-based ferroelectric thin film is for a capacitor, and the film thickness of the PZT-based ferroelectric thin film is in a range of 100 nm to 500 nm.

A seventh aspect of the invention is an invention based on the third aspect, in which the PZT-based ferroelectric thin film is for a piezoelectric element, and the film thickness of the PZT-based ferroelectric thin film is in a range of 1000 nm to 5000 nm.

An eighth aspect of the invention is a method of manufacturing a PZT-based ferroelectric thin film on the lower electrode 11 by coating, calcining, and then firing so as to crystallize a PZT-based ferroelectric thin film-forming composition on the lower electrode 11 of the substrate 10 having the lower electrode 11 in which the crystal plane is oriented in the (111) axis direction, in which some of the PZT-based ferroelectric thin film-forming composition is coated, calcined, and fired on the lower electrode 11 so as to form the orientation controlling layer 12, the remainder of the PZT-based ferroelectric thin film-forming composition is coated, calcined, and fired on the orientation controlling layer 12 so as to form the film thickness adjusting layer 13 having the same crystal orientation as the crystal orientation of the orientation controlling layer 12, calcination and firing are controlled during formation of the orientation controlling layer 12 so as to have the interface 14 between the orientation controlling layer 12 and the film thickness adjusting layer 13, and the coating amount of some of the PZT-based ferroelectric thin film-forming composition is set so that the layer thickness of the crystallized orientation controlling layer 12 becomes in a range of 45 nm to 270 nm, thereby making crystals in the orientation controlling layer 12 preferentially oriented in the (111) plane.

A ninth aspect of the invention is to provide a complex electronic component, such as a thin film capacitor, a capacitor, an IPD, a non-volatile memory, a DRAM memory capacitor, a laminate capacitor, a gate insulating body in a transistor, a pyroelectric infrared detecting element, a piezoelectric element, an electro-optic element, an actuator, a resonate, a ultrasonic motor or an LC noise filter element, having a PZT-based ferroelectric thin film manufactured using the method according to the eight aspect.

Advantage of the Invention

According to the PZT-based ferroelectric thin film of the first aspect of the invention, in the PZT-based ferroelectric thin film formed on the lower electrode 11 of the substrate 10 having the lower electrode 11 in which the crystal plane is oriented in a (111) axis direction, since the PZT-based ferroelectric thin film has the orientation controlling layer 12 which is formed on the lower electrode 11 and has a layer thickness in which a crystal orientation is controlled in a (111) plane preferentially in a range of 45 nm to 270 nm, and the film thickness adjusting layer 13 which is formed on the orientation controlling layer 12 and has the same crystal orientation as the crystal orientation of the orientation controlling layer 12, and the interface 14 is formed between the orientation controlling layer 12 and the film thickness adjusting layer 13, the interface introduced into the inside of the PZT-based ferroelectric thin film plays a role of a trap which suppresses the mobility of oxygen defects. Thereby, it is possible to generate a delay phenomenon of the maximum leak current caused by the decrease in the mobility of oxygen defects, and it also becomes possible to have high lifetime reliability.

In the PZT-based ferroelectric thin film of the second aspect of the invention, since the average value of the maximum unidirectional diameter of crystal grains present in the orientation controlling layer 12 is in a range of 200 nm to 5000 nm, it become possible to have higher lifetime reliability.

In the PZT-based ferroelectric thin film of the third aspect of the invention, since the average value of the maximum unidirectional diameter of crystal grains present in the orientation controlling layer 12 is in a range of less than 200 nm, it becomes possible to have a fine and uniform crystal structure and to have high lifetime reliability.

In the PZT-based ferroelectric thin film of the fourth aspect, since the orientation controlling layer 12 is formed on the lower electrode 11 through the grain diameter controlling layer 15 when the average value of the maximum unidirectional diameter of crystal grains present in the orientation controlling layer 12 is in a range of less than 200 nm, it becomes possible to have a fine and uniform crystal structure and to have high lifetime reliability.

The above effect is particularly effective when the layer thickness of the orientation controlling layer 12 is as thin as 45 nm to 150 nm. When the film thickness of the orientation controlling layer 12 is thin, the generation frequency of crystal nuclei decreases such that the crystals abnormally grow, and there was a disadvantage that it becomes difficult to obtain a uniform continuous film. However, when the grain diameter controlling layer is formed between the lower electrode 11 and the orientation controlling layer 12 as described above, it is possible to solve the above disadvantage. As such, in a case in which the layer thickness of the orientation controlling layer 12 is thin, when the interface 14 is formed, and the grain diameter controlling layer 15 is provided, a fine and uniform crystal structure is formed, and it is possible to have high lifetime reliability in association with the formation of the interface 14.

In the PZT-based ferroelectric thin film of the fifth aspect of the invention, since the film thickness of the ferroelectric thin film is in a range of 100 nm to 5000 nm, it becomes possible to arbitrarily adjust the PZT-based ferroelectric thin film in accordance with the use of an electronic device or an electronic component having the PZT-based ferroelectric thin film.

When the total film thickness of the PZT-based ferroelectric thin film of the sixth aspect of the invention is in a range of 100 nm to 500 nm, it is possible to provide the PZT-based ferroelectric thin film for a capacitor.

When the total film thickness of the PZT-based ferroelectric thin film of the seventh aspect of the invention is in a range of 1000 nm to 5000 nm, it is possible to provide the PZT-based ferroelectric thin film for a piezoelectric element.

In the method of manufacturing a PZT-based ferroelectric thin film of the eighth aspect of the invention, it is possible to manufacture the PZT-based ferroelectric thin film of the first aspect. Therefore, since the PZT-based ferroelectric thin film has the orientation controlling layer 12 which is formed on the lower electrode 11 and has a layer thickness in which a crystal orientation is preferentially controlled in the (111) plane in a range of 45 nm to 270 nm, and the film thickness adjusting layer 13 which is formed on the orientation controlling layer 12 and has the same crystal orientation as the crystal orientation of the orientation controlling layer 12, and the interface 14 is present between the orientation controlling layer 12 and the film thickness adjusting layer 13, when the interface 14 is formed between the orientation controlling layer 12 and the film thickness adjusting layer 13, the interface introduced into the inside of the PZT-based ferroelectric thin film plays a role of a trap which suppresses the mobility of oxygen defects. Thereby, it is possible to generate a delay phenomenon of the maximum leak current caused by the decrease in the mobility of oxygen defects, and a PZT-based ferroelectric thin film having higher lifetime reliability can be provided.

In the method of manufacturing a PZT-based ferroelectric thin film of the eighth aspect, the grain diameter controlling layer 15 may be formed on the lower electrode 11 before the orientation controlling layer 12 is formed by coating, calcining, and firing some of the ferroelectric thin film-forming composition on the lower electrode 11. The grain diameter controlling layer 15 increases the generation frequency of nuclei, and it is possible to manufacture a PZT-based ferroelectric thin film having a fine crystal structure and the crystal orientation preferentially controlled in the (111) plane.

BEST MODE FOR CARRYING OUT THE INVENTION

Embodiments for carrying out the invention will be described hereinafter based on the accompanying drawings.

<Configuration of the PZT-Based Ferroelectric Thin Film>

First, the configuration of the PZT-based ferroelectric thin film will be described with reference to FIG. 1. The PZT-based ferroelectric thin film according to the invention is an improvement of a PZT-based ferroelectric thin film having an orientation controlling layer 12 and a film thickness adjusting layer 13 on a lower electrode 11 by coating and heating so as to crystallize a PZT-based ferroelectric thin film-forming composition on the lower electrode 11 of a substrate 10 having the lower electrode 11 in which the crystal plane is oriented in a (111) axis direction as shown in FIG. 1. The characteristic configuration of the invention is that an interface 14 is formed between the orientation controlling layer 12 and the film thickness adjusting layer 13.

The substrate 10 is made of a heat-resistant substrate such as a silicon substrate or a sapphire substrate. In addition, the lower electrode 11 is formed by depositing a material which has a conductivity and does not react with the PZT-based ferroelectric thin film, such as Pt, Ir, or Ru, on the substrate 10 using a sputtering method. In the lower electrode 11, the crystal plane is oriented in the (111) axis direction.

The orientation controlling layer 12 is a Pb-containing perovskite PZT-based ferroelectric layer which is formed on the lower electrode 11 in which the crystal plane of the substrate 10 is oriented in the (111) axis direction, and has the crystal orientation preferentially controlled in the (111) plane. The orientation controlling layer 12 is made to have a film thickness in a range of 45 nm to 270 nm after crystallization. When the layer thickness of the crystallized orientation controlling layer 12 is specified to be in the above range, it is possible to readily obtain a PZT-based ferroelectric thin film in which the crystal orientation is preferentially controlled in the (111) plane.

It is assumed that the orientation controlling layer can be crystal-oriented preferentially in the (111) plane because the orientation controlling layer is oriented depending on the (111) axis direction of the lower electrode 11. The reason why the layer thickness of the crystallized orientation controlling layer 12 is set to 45 nm to 270 nm is that there is a disadvantage that it becomes difficult to obtain a uniform continuous film at a layer thickness of less than 45 nm, and there is a disadvantage that the process time for forming the orientation controlling layer 12 increases at a layer thickness of more than 270 nm. The layer thickness is preferably 45 nm to 270 nm.

Furthermore, the average value of the maximum unidirectional diameter of crystal grains present in the orientation controlling layer 12 is preferably set to less than 200 nm or in a range of 200 nm to 5000 nm. The reason is that, when the average value exceeds 5000 nm, there is a disadvantage that it becomes difficult to manufacture a uniform film. The average value is preferably 200 nm to 5000 nm. Meanwhile, the average value of the maximum unidirectional diameter of crystal grains present in the orientation controlling layer is a value obtained by photographing the surface of the ferroelectric thin film using a scanning electron microscope (hereinafter referred to as SEM), measuring the crystal grain diameters of 100 arbitrary crystal grains on the photographed SEM image at the maximum unidirectional diameter (Krumbein diameter), and computing the average thereof.

In the film thickness adjusting layer 13, a crystal orientation plane having the same tendency as the orientation controlling layer 12 is formed on the orientation controlling layer 12 along the preferentially oriented plane of the orientation controlling layer 12. When the layer thickness of the film thickness adjusting layer 13 is changed, the total film thickness of the PZT-based ferroelectric thin film can be increased and decreased depending on the usage, and it is possible to manufacture a PZT-based ferroelectric thin film in which the crystal orientation is preferentially controlled in the (111) plane by forming the preferentially oriented plane of the orientation controlling layer 12 in the (111) plane. The film thickness adjusting layer 13 is made into the same Pb-containing perovskite PZT-based ferroelectric film as the orientation controlling layer 12. The layer thickness of the film thickness adjusting layer 13 is preferably less than 5000 nm. It is because the process time increases when the layer thickness exceeds 5000 nm. Furthermore, in the PZT-based ferroelectric thin film according to the invention, it is also possible to form the interface 14 at a location 45 nm to 270 nm above the lower electrode 11, which substantially matches the layer thickness of the orientation controlling layer 12, and to form the grain diameter controlling layer 15 between the lower electrode 11 and the orientation controlling layer as shown in FIG. 2. Using the grain diameter controlling layer 15, even in a case in which the layer thickness of the orientation controlling layer 12 is as thin as approximately 45 nm to 150 nm, it is possible to favorably manufacture a PZT-based ferroelectric thin film which has a high generation frequency of nuclei, a fine crystal structure, and the crystal orientation preferentially controlled in the (111) plane.

<PZT-Based Ferroelectric Thin Film-Forming Raw Materials>

As PZT-based ferroelectric thin film-forming raw materials, first, raw materials for forming the orientation controlling layer 12 and the film thickness adjusting layer 13 will be described hereinafter.

Such a PZT-based ferroelectric thin film-forming composition is prepared using an organic metal compound solution which contains raw materials for configuring a complex metal oxide dissolved in an organic solvent so as to obtain a ratio at which a desired metal atomic ratio is supplied. The PZT-based ferroelectric thin film to be manufactured is preferably a Pb-containing perovskite oxide, and the ferroelectric thin film may be based on PLZT, PMnZT, PNbZT, or the like other than PZT.

The raw material of the complex metal oxide is preferably a compound in which organic groups are bonded to the respective metal elements of Pb, La, Zr and Ti through oxygen or nitrogen atoms thereof. Examples thereof include one or two selected from a group consisting of metal alkoxides, metal diol complexes, metal triol complexes, metal carboxylates, metal β-diketonate complexes, metal β-diketoester complexes, metal β-iminoketo complexes and metal amino complexes. A particularly preferable compound is a metal alkoxide, a partial hydrolysate thereof, an organic salt. Among the above, examples of a Pb compound and a La compound include acetates (lead acetate: $Pb(OA_c)_2$, lanthanum acetate: $La(OA_c)_3$), lead diisopropoxide: $Pb(OiPr)_2$, lanthanum triisopropoxide: $La(OiPr)_3$, and the like. Examples of a Ti compound include alkoxides such as titanium tetraethoxide: $Ti(OEt)_4$, titanium tetraisopropoxide: $Ti(OiPr)_4$, titanium tetra n-butoxide: $Ti(OiBu)_4$, titanium tetraisobutoxide: $Ti(OiBu)_4$, titanium tetra t-butoxide: $Ti(OtBu)_4$, and titanium dimethoxy diisopropoxide: $Ti(OMe)_2(OiPr)_2$. As a Zr compound, the same alkoxide as for the Ti compound is preferable. The metal alkoxide may be used as it is, but a partial hydrolysate thereof may be used in order to accelerate decomposition.

A PZT-based ferroelectric thin film-forming composition using the above raw material is prepared in the following manner. First, the raw materials are dissolved in an appropriate solvent at a ratio corresponding to a desired PZT-based ferroelectric thin film composition, and are adjusted to a concentration suitable for coating. This preparation enables the obtaining of a PZT-based ferroelectric thin film-forming composition, which becomes a precursor solution, typically using a liquid synthesis flow as below. A Zr source (for example, Zr tetra n-butoxide), a Ti source (for example, Ti isopropoxide), and a stabilizer (for example, acetyl acetone) are put into a reaction vessel, and are refluxed in a nitrogen atmosphere. Next, a Pb source (for example, lead acetate trihydrate) is added to the refluxed compound, a solvent (for example, propylene alcohol) is added, the solution is refluxed in a nitrogen atmosphere, is distilled under reduced pressure so as to remove byproducts, then, propylene alcohol is further added to the solution so as to adjust the concentration, and, furthermore, 1-butanol is added to this solution. As a result, the PZT-based ferroelectric thin film-forming composition is obtained.

The solvent used here is appropriately determined depending on the raw materials to be used, and general examples thereof that can be used include carboxylic acids, alcohols (for example, propylene glycol which is a multivalent alcohol), esters, ketones (for example, acetone and methyl ethyl ketone), ethers (for example, dimethyl ether and diethyl ether), cycloalkanes (for example, cyclohexane and cyclohexanol), aromatic solvents (for example, benzene, toluene and xylene), other tetrahydrofuran, or a mixed solvent of two or more thereof.

Specific examples of the carboxylic acids that is preferably used include n-butyric acid, α-methyl butyric acid, i-valeric acid, 2-ethyl butyric acid, 2,2-dimethyl butyric acid, 3,3-dimethyl butyric acid, 2,3-dimethyl butyric acid, 3-methyl pentanoic acid, 4-methyl pentanoic acid, 2-ethyl pentanoic acid, 3-ethyl pentanoic acid, 2,2-dimethyl pentanoic acid, 3,3-dimethyl pentanoic acid, 2,3-dimethyl pentanoic acid, 2-ethyl hexanoic acid, and 3-ethyl hexanoic acid.

In addition, ethyl acetate, propyl acetate, n-butyl acetate, sec-butyl acetate, tert-butyl acetate, isobutyl acetate, n-amyl acetate, sec-amyl acetate, tert-amyl acetate or isoamyl acetate is preferably used as the ester, and 1-propanol, 2-propanol, 1-butanol, 2-butanol, isobutyl alcohol, 1-pentanol, 2-pentanol, 2-methyl-2-pentanol, or 2-methoxy ethanol is preferably used as the alcohol.

The total concentration of an organic metal oxide in the organic metal compound solution of the PZT-based ferroelectric thin film-forming composition is preferably set to approximately 0.1 mass % to 20 mass % in terms of the amount of the metal oxide.

In this organic metal compound solution, a β-diketone (for example, acetyl acetone, heptafluorobutanoyl pivaloyl methane, dipivaloyl methane, trifluoroacetyl acetone, benzoyl acetone, or the like), a β-ketone (for example, acetoacetic acid, propionyl acetate, benzoyl acetate, or the like), a β-ketoester (for example, a lower alkyl ester such as methyl, propyl, or butyl of the above keto acid), an oxyacid (for example, lactic acid, glycolic acid, α-hydroxybutyric acid, salicylic acid, or the like), a lower alkyl ester of the above oxyacid, an oxyketone (for example, diacetone alcohol, acetoine, or the like), a diol, a triol, a higher carboxylic acid, an alkanol amine (for example, diethanolamine, triethanolamine, monoethanolamine), a multivalent amine, or the like may be added as a stabilizer as necessary (the number of molecules of the stabilizer)/(the number of metal atoms) of approximately 0.2 to 3.

The PZT-based ferroelectric thin film-forming composition preferably includes a β-diketone and a multivalent alcohol. Among the above, acetyl acetone is particularly preferable as the β-diketone, and propylene glycol is particularly preferable as the multivalent alcohol.

Further, particles that may be present in the solution may be removed as necessary by carrying out a filtration treatment or the like on the prepared organic metal compound solution. This is to secure the long-term storage stability of the organic metal compound solution.

In addition, the grain diameter controlling layer 15 may be formed between the lower electrode 11 and the orientation controlling layer 12 as shown in FIG. 2. A composition raw material for forming the grain diameter controlling layer 15 includes lead titanate, lead zirconate titanate, lead zirconate, and the like. In addition, basically, the solution is prepared using the same method as for the PZT-based ferroelectric thin film-forming composition solution for the orientation controlling layer 12 or the film thickness adjusting layer 13. For example, when the PZT-based ferroelectric solution includes the raw material of the composition for forming the orientation controlling layer 12 at 10 mass %, and Pb/Zr/Ti is 110/52/48 respectively, the raw material of the grain diameter controlling layer 15 is a ferroelectric solution including 2 mass % of Pb and Ti in which Pb/Ti can be set to 125/100. When the grain diameter controlling layer 15 is produced using a solution of the above composition, it is possible to manufacture a PZT-based ferroelectric thin film having a fine crystal structure in which the average crystal grain of the obtained PZT-based ferroelectric thin film is controlled to be less than 200 nm.

<Method of Forming the PZT-Based Ferroelectric Thin Film>

Next, a method of forming a PZT-based ferroelectric thin film by coating, calcining, and firing a solution including the PZT-based ferroelectric thin film-forming composition according to the embodiment, which has been prepared in the above, on the lower electrode 11 of the substrate 10 of the orientation controlling layer 12 and the film thickness adjusting layer 13 will be described hereinafter.

First, the orientation controlling layer 12 is formed by coating a solution including the prepared PZT-based ferroelectric thin film-forming composition on the lower electrode 11 using a coating method such as spin coating, dip coating, or liquid source misted chemical deposition (LSMCD), carrying out drying and calcination using a hot plate or the like, forming a gel film so that the layer thickness becomes 45 nm to 270 nm after firing, and then firing the composition.

Next, the film thickness adjusting layer 13 is formed on the orientation controlling layer 12 in the following manner. The same solution is coated using the same coating method as above, is dried and calcined using a hot plate or the like, the processes from coating through drying and calcination are repeated, a gel film having a layer thickness in a desired range is formed, and then fired at once, or the processes from coating through firing are repeated depending on the necessary total film thickness, thereby forming the film thickness adjusting layer. For example, in the schematic cross-sectional view of FIG. 1 or 2, there are three dotted-line portions, and one dotted-line portion corresponds to one cycle of the processes from coating through drying and calcination. That is, the film thickness adjusting layer 13 in FIG. 1 is an example of a layer manufactured by repeating the processes from coating through drying and calcination four times. The total film thickness of the PZT-based ferroelectric thin film is adjusted using the film thickness adjusting layer 13, but the layer thickness of the film thickness adjusting layer 13 is adjusted depending on the usage of the same thin film, for example, whether the thin film is for a capacitor or for a piezoelectric element.

Next, drying, calcination and firing, which are common for the orientation controlling layer 12 and the film thickness adjusting layer 13, will be described hereinafter.

Drying and calcination are carried out in order to remove the solvent and to thermally decompose or hydrolyze the organic metal compound so as to transform the organic metal compound into a complex oxide. Therefore, drying and calcination is carried out in the atmospheric atmosphere, an oxidation atmosphere, or a water vapor-including atmosphere. Moisture necessary for hydrolysis is sufficiently secured from the humidity in the air even during heating in the air. This heating may be carried out in two steps of low-temperature heating for removing the solvent and high-temperature heating for decomposing the organic metal compound. Drying and calcination are carried out at a treatment temperature of 150° C. to 550° C. for a treatment time of 1 minute to 10 minutes.

Firing is a process for heating a thin film obtained through drying and calcination at a temperature that is the crystallization temperature or higher so as to crystallize the thin film, and the PZT-based ferroelectric thin film is obtained through firing. The firing atmosphere in the crystallization process is preferably $O_2$, $N_2$, Ar, $N_2O$, $H_2$, a gas mixture thereof, or the like.

Firing is carried out at a treatment temperature of 450° C. to 800° C. for a treatment time of approximately 1 minute to 60 minutes. Firing may be carried out through a rapid thermal annealing (RTA) treatment. In a case in which firing is carried out through the RTA treatment, the temperature-rise rate is preferably set to 10° C./second to 100° C./second.

The interface 14, which is a characteristic of the invention, is formed between the process in which the orientation controlling layer 12 is formed and the process in which the film thickness adjusting layer 13 is formed. The presence of the interface 14 leads to higher lifetime reliability. This is assumed that, since the interface introduced into the inside of the PZT-based ferroelectric thin film plays a role of a trap which suppresses the mobility of oxygen defects, and a delay phenomenon of the maximum leak current is caused due to a decrease in the mobility of oxygen defects, high lifetime reliability is obtained.

Furthermore, a method of forming the grain diameter controlling layer 15 between the lower electrode 11 and the orientation controlling layer 12, which is shown in FIG. 2, will be described. Similarly to the orientation controlling layer 12, the grain diameter controlling layer is obtained by coating a composition for the grain diameter controlling layer 15 using a coating method, such as spin coating, dip coating or LSMCD, on the lower electrode 11 oriented in the (111) axis direction, carrying out drying and calcination using a hot plate or the like at 150° C. to 550° C. for 1 minute to 10 minutes, and repeating the processes from coating through drying and calcination, thereby forming a gel film having a film thickness in a desired range. The above orientation controlling layer 12 may be formed on the grain diameter controlling layer 15 in the above manner. The layer thickness of the grain diameter controlling layer 15 is preferably set to 1 nm to 10 nm. This is because, in a case in which the grain diameter controlling layer 15 exceeds 10 nm, the generation frequency of nuclei does not improve, and, consequently, a fine crystal structure cannot be obtained.

The PZT-based ferroelectric body manufactured in the above manner preferably has a total film thickness in a range of 100 nm to 500 nm for the use in capacitors. The reason for limiting to the above range is that, when the total film thickness is less than 100 nm, there is a disadvantage that the insulation pressure resistance of the PZT-based ferroelectric thin film decreases, and, when the total film thickness exceeds 500 nm, there is a disadvantage that the electrostatic capacitance decreases as a capacitor. In addition, the PZT-based ferroelectric body manufactured in the same method preferably has a total film thickness in a range of 1000 nm to 5000 nm for the use in piezoelectric elements. The reason for limiting to the above range is that, when the total film thickness is less than 1000 nm, there is a disadvantage that a piezoelectric driving force necessary for the piezoelectric element cannot be secured, and, when the total film thickness exceeds 5000 nm, there is a disadvantage that the process time increases.

As thus far described in the embodiment, the PZT-based ferroelectric thin film of the invention can secure higher lifetime reliability while maintaining the same dielectric characteristics as a PZT-based ferroelectric thin film of the related art.

In addition, the ferroelectric thin film of the invention can be preferably used as a component material of a complex electronic component, such as a thin film capacitor, a capacitor, an IPD, a DRAM memory capacitor, a laminate capacitor, a gate insulating body in a transistor, a non-volatile memory, a pyroelectric infrared detecting element, a piezoelectric element, an electro-optic element, an actuator, a resonate, an ultrasonic motor or an LC noise filter element.

EXAMPLES

Next, examples of the invention will be described in detail along with comparative examples.

First, preparation of a solution of a PZT-based ferroelectric thin film, which is common in examples and comparative examples, will be mentioned. Zirconium tetra n-butoxide and acetyl acetone as a stabilizer were added to a reaction vessel, and refluxed in a nitrogen atmosphere at a temperature of 150° C. Titanium tetraisopropoxide and acetyl acetone as a stabilizer were added to the mixture, and refluxed in a nitrogen atmosphere at a temperature of 150° C. Next, lead acetate trihydrate and propylene glycol as a solvent were added to the mixture, and refluxed in a nitrogen atmosphere at a temperature of 150° C. After that, the solution was distilled under reduced pressure at 150° C. so as to remove byproducts, and, furthermore, a diluted alcohol was added, thereby obtaining a solution of a PZT-based ferroelectric composition adjusted to contain a metal compound having a Pb/Zr/Ti composition ratio of 110/52/48 respectively at a desired concentration in terms of an oxide.

Similarly, preparation of a solution of a ferroelectric composition for a grain diameter controlling layer, which is common in examples, will be mentioned. Titanium tetraisopropoxide and acetyl acetone as a stabilizer were added to a reaction vessel, and refluxed in a nitrogen atmosphere at a temperature of 150° C. Next, lead acetate trihydrate and propylene glycol as a solvent were added to the mixture, and refluxed in a nitrogen atmosphere at a temperature of 150° C. After that, the solution was distilled under reduced pressure at 150° C. so as to remove byproducts, and, furthermore, a diluted alcohol was added, thereby obtaining a solution of a ferroelectric composition for a grain diameter controlling layer which is adjusted to contain a metal compound having a Pb/Ti composition ratio of 125/100 at a concentration of 2 mass % in terms of an oxide.

Example 1

As a substrate, a silicon substrate having a Pt lower electrode film formed on the surface using a sputtering method was prepared. The PZT-based ferroelectric composition for the orientation controlling layer 12 having a concentration of 12 mass %, which had been adjusted in the above, was coated on the Pt lower electrode film 11 of the substrate using a spin coating method under conditions of at 500 rpm for 3 seconds and then 2000 rpm for 20 seconds (hereinafter referred to as the "orientation controlling layer coating step"). Subsequently, the composition was heated at 350° C. for 5 minutes in the atmosphere using a hot plate so as to carry out drying and calcination (hereinafter referred to as the "orientation controlling layer calcination step"). A process of coating and calcining the PZT-based ferroelectric composition for the orientation controlling layer was repeated twice, and then firing in which the composition was heated at 700° C. and a temperature-rise rate of 10° C./second in the oxygen atmosphere for 1 minute was carried out so as to crystallize the composition, thereby obtaining the orientation controlling layer 12 having a layer thickness of 150 nm (hereinafter the "orientation controlling layer firing step"). Next, the PZT-based ferroelectric composition for the film thickness adjusting layer 13 having a concentration of 10 mass %, which had been adjusted in the above, was coated on the orientation controlling layer 12 using a spin coating method under conditions of at 500 rpm for 3 seconds and then 3000 rpm for 15 seconds (hereinafter referred to as the "film thickness adjusting layer coating step"). Subsequently, the composition was heated at 350° C. for 5 minutes in the atmosphere using a hot plate so as to carry out drying and calcination (the film thickness adjusting layer calcination step"). A process of coating and calcining the PZT-based ferroelectric composition for the film thickness adjusting layer 13 was repeated three times, and then firing in which the composition was heated at 700° C. and a temperature-rise rate of 10° C./second in the oxygen atmosphere for 1 minute was carried out so as to crystallize the composition, thereby obtaining the film thickness adjusting layer 13 having a layer thickness of 135 nm (hereinafter the "film thickness adjusting layer firing step"). A PZT-based ferroelectric thin film having a total film thickness of 285 nm was manufactured in the above manner.

Example 2

In the orientation controlling layer coating step, the PZT-based ferroelectric composition for the orientation controlling layer having a concentration of 12 mass %, which had been adjusted in the above, was coated under conditions of at 500 rpm for 3 seconds and then 2000 rpm for 20 seconds. In the orientation controlling layer calcination step, the drying and calcination conditions were at 350° C. for 5 minutes. The orientation controlling layer coating step and the orientation controlling layer calcination step were carried out only once. Thereby, the orientation controlling layer 12 having a layer thickness of 75 nm was obtained. In the film thickness adjusting layer coating step, the coating conditions were at 500 rpm for 3 seconds and then 3000 rpm for 15 seconds. In the film thickness adjusting layer calcination step, the drying and calcination conditions were at 350° C. for 5 minutes. The film thickness adjusting layer coating step and the film thickness adjusting layer calcination step were repeated five times. Thereby, the film thickness adjusting layer 13 having a layer thickness of 225 nm was obtained. A PZT-based ferroelectric thin film having a total film thickness of 300 nm was manufactured in the same manner as in Example 1 except the above.

Example 3

In the orientation controlling layer coating step, the PZT-based ferroelectric composition for the orientation controlling layer having a concentration of 10 mass %, which had been adjusted in the above, was coated under conditions of at 500 rpm for 3 seconds and then 3000 rpm for 15 seconds. In the orientation controlling layer calcination step, the drying and calcination conditions were at 350° C. for 5 minutes. The orientation controlling layer coating step and the orientation controlling layer calcination step were carried out only once. Thereby, the orientation controlling layer 12 having a layer thickness of 45 nm was obtained. In the film thickness adjusting layer coating step, the coating conditions were at 500 rpm for 3 seconds and then 3000 rpm for 15 seconds. In the film thickness adjusting layer calcination step, the drying and calcination conditions were at 350° C. for 5 minutes. The film thickness adjusting layer coating step and the film thickness adjusting layer calcination step were repeated five times. Thereby, the film thickness adjusting layer 13 having a layer thickness of 225 nm was obtained. A PZT-based ferroelectric thin film having a total film thickness of 270 nm was manufactured in the same manner as in Example 1 except the above.

Example 4

Prior to the orientation controlling layer coating step, the ferroelectric composition for the grain diameter controlling layer was coated on the Pt lower electrode film 11 under conditions of at 500 rpm for 3 seconds and then 2000 rpm for 20 seconds (in Examples 5 and 7, referred to similarly as the "grain diameter controlling layer coating step"). A ferroelectric composition prepared in the above manner was used as the ferroelectric composition for the grain diameter controlling layer. Thereby, the grain diameter controlling layer 15 having a layer thickness of 5 nm was obtained. The orientation controlling layer 12 was formed on the grain diameter controlling layer. In the orientation controlling layer coating step, the PZT-based ferroelectric composition for the orientation controlling layer having a concentration of 12 mass %, which had been adjusted in the above, was coated under conditions of at 500 rpm for 3 seconds and then 2000 rpm for 20 seconds. In the orientation controlling layer calcination step, the drying and calcination conditions were at 350° C. for 5 minutes. The orientation controlling layer coating step and the orientation controlling layer calcination step were carried out only once. Thereby, the orientation controlling layer 12 having a layer thickness of 75 nm was obtained. In the film thickness adjusting layer coating step, the PZT-based ferroelectric composition for the orientation controlling layer having a concentration of 10 mass %, which had been adjusted in the above, was coated under conditions of at 500 rpm for 3 seconds and then 3000 rpm for 15 seconds. In the film thickness adjusting layer calcination step, the drying and calcination conditions were at 350° C. for 5 minutes. The film thickness adjusting layer coating step and the film thickness adjusting layer calcination step were repeated five times. Thereby, the film thickness adjusting layer 13 having a layer thickness of 225 nm was obtained. A PZT-based ferroelectric thin film having a total film thickness of 305 nm was manufactured in the same manner as in Example 1 except the above.

Example 5

In the grain diameter controlling layer coating step, the coating conditions were 500 rpm for 3 seconds and then 2000 rpm for 20 seconds. Thereby, the grain diameter controlling layer 15 having a layer thickness of 5 nm was obtained. The PZT-based ferroelectric composition for the orientation controlling layer having a concentration of 10 mass %, which had been adjusted in the above, was coated under conditions of at 500 rpm for 3 seconds and then 3000 rpm for 15 seconds. In the orientation controlling layer calcination step, the drying and calcination conditions were at 350° C. for 5 minutes. The orientation controlling layer coating step and the orientation controlling layer calcination step were repeated twice. Thereby, the orientation controlling layer 12 having a layer thickness of 90 nm was obtained. In the film thickness adjusting layer coating step, the PZT-based ferroelectric composition for the orientation controlling layer having a concentration of 10 mass %, which had been adjusted in the above, was coated under conditions of 500 rpm for 3 seconds and then 3000 rpm for 15 seconds. In the film thickness adjusting layer calcination step, the drying and calcination conditions were at 350° C. for 5 minutes. The film thickness adjusting layer coating step and the film thickness adjusting layer calcination step were repeated four times. Thereby, the film thickness adjusting layer 13 having a layer thickness of 180 nm was obtained. A PZT-based ferroelectric thin film having a total film thickness of 275 nm was manufactured in the same manner as in Example 4 except the above.

Comparative Example 1

In the grain diameter controlling layer coating step, the PZT-based ferroelectric composition for the orientation controlling layer having a concentration of 10 mass %, which had been adjusted in the above, was coated under conditions of 500 rpm for 3 seconds and then 3000 rpm for 15 seconds. In the orientation controlling layer calcination step, the drying and calcination conditions were at 350° C. for 5 minutes. The orientation controlling layer coating step and the orientation controlling layer calcination step were repeated six times. Thereby, the orientation controlling layer 12 having a layer thickness of 270 nm was obtained. Thereby, the orientation controlling layer 12 having a layer thickness of 270 nm was obtained. A PZT-based ferroelectric thin film having a total film thickness of 270 nm was manufactured in the same manner as in Example 1 except the above. Further, in the same thin film of Comparative example 1, there was no film thickness controlling layer 12, that is, there was no interface 14. The PZT-based ferroelectric thin films of Examples 1 to 5 and Comparative example 1 are shown in Table 1 respectively. In addition, a test for comparing the PZT-based ferroelectric thin films is considered as Comparison test 1.

TABLE 1

| | Grain diameter controlling layer Layer thickness (nm) | Orientation controlling layer Layer thickness (nm) | Film thickness adjusting layer Layer thickness (nm) | Preferentially oriented plane | PZT film Grain diameter (nm) | Total film thickness (nm) | MTF (seconds) at 160° C., 14 V | MTF (seconds) at 225° C., 100 V | Dielectric constant |
|---|---|---|---|---|---|---|---|---|---|
| Example 1 | 0 | 150 | 135 | (111) | 200 | 285 | 9730 | — | 1446 |
| Example 2 | 0 | 75 | 225 | (111) | 400 | 300 | 10000 | — | 1461 |
| Example 3 | 0 | 45 | 225 | (111) | 5000 | 270 | 8860 | — | 1489 |
| Example 4 | 5 | 75 | 225 | (111) | 100 | 305 | 7310 | — | 1452 |
| Example 5 | 5 | 90 | 180 | (111) | 50 | 275 | 4620 | — | 1438 |
| Comparative example 1 | 0 | 270 | 0 | (111) | 50 | 270 | 3380 | — | 1540 |

Example 6

In the orientation controlling layer coating step, the PZT-based ferroelectric composition for the orientation controlling layer having a concentration of 12 mass %, which had been adjusted in the above, was coated under conditions of at 500 rpm for 3 seconds and then 2000 rpm for 20 seconds. In the orientation controlling layer calcination step, the drying and calcination conditions were at 350° C. for 5 minutes. The orientation controlling layer coating step and the orientation controlling layer calcination step were carried out only once. Thereby, the orientation controlling layer 12 having a layer thickness of 75 nm was obtained. In the film thickness adjusting layer coating step, the PZT-based ferroelectric composition for the orientation controlling layer having a concentration of 10 mass %, which had been adjusted in the above, was coated under conditions of at 500 rpm for 3 seconds and then 3000 rpm for 15 seconds. In the film thickness adjusting layer calcination step, the drying and calcination conditions were at 350° C. for 5 minutes. The film thickness adjusting layer coating step and the film thickness adjusting layer calcination step were carried out only once. Thereby, the film thickness adjusting layer 13 having a layer thickness of 45 nm was obtained. A PZT-based ferroelectric thin film having a total film thickness of 120 nm was manufactured in the same manner as in Example 1 except the above.

Example 7

In the orientation controlling layer coating step, the coating conditions were 500 rpm for 3 seconds and then 2000 rpm for 20 seconds. Thereby, the grain diameter controlling layer 15 having a layer thickness of 5 nm was obtained. the PZT-based ferroelectric composition for the orientation controlling layer having a concentration of 10 mass %, which had been adjusted in the above, was coated under conditions of at 500 rpm for 3 seconds and then 3000 rpm for 15 seconds. In the orientation controlling layer calcination step, the drying and calcination conditions were at 350° C. for 5 minutes. The orientation controlling layer coating step and the orientation controlling layer calcination step were repeated twice.

Thereby, the orientation controlling layer 12 having a layer thickness of 90 nm was obtained. In the film thickness adjusting layer coating step, the coating conditions were 500 rpm for 3 seconds and then 3000 rpm for 15 seconds. In the film thickness adjusting layer calcination step, the drying and calcination conditions were at 350° C. for 5 minutes. The film thickness adjusting layer coating step and the film thickness adjusting layer calcination step were carried out only once. Thereby, the film thickness adjusting layer 13 having a layer thickness of 45 nm was obtained. A PZT-based ferroelectric thin film having a total film thickness of 135 nm was manufactured in the same manner as in Example 4 except the above.

The PZT-based ferroelectric thin films of Examples 6 and 7 and Comparative examples 2 and 3 are shown in Table respectively. In addition, a test for comparing the PZT-based ferroelectric thin films is considered as Comparison test 2.

TABLE 2

|  | Grain diameter controlling layer Layer thickness (nm) | Orientation controlling layer Layer thickness (nm) | Film thickness adjusting layer Layer thickness (nm) | Preferentially oriented plane | PZT film Grain diameter (nm) | Total film thickness (nm) | MTF (seconds) at 160° C., 14 V | MTF (seconds) at 225° C., 100 V | Dielectric constant |
|---|---|---|---|---|---|---|---|---|---|
| Example 6 | 0 | 75 | 45 | (111) | 400 | 120 | 219 | — | 1415 |
| Example 7 | 5 | 90 | 45 | (111) | 50 | 135 | 177 | — | 1403 |
| Comparative example 2 | 0 | 150 | 0 | (111) | 200 | 150 | 34 | — | 1425 |
| Comparative example 3 | 0 | 135 | 0 | (111) | 50 | 135 | 27 | — | 1516 |

Comparative Example 2

In the orientation controlling layer coating step, the PZT-based ferroelectric composition for the orientation controlling layer having a concentration of 12 mass %, which had been adjusted in the above, was coated under conditions of 500 rpm for 3 seconds and then 2000 rpm for 20 seconds. In the orientation controlling layer calcination step, the drying and calcination conditions were at 350° C. for 5 minutes. The orientation controlling layer coating step and the orientation controlling layer calcination step were repeated twice. Thereby, the orientation controlling layer 12 having a layer thickness of 150 nm was obtained. Thereby, the orientation controlling layer 12 having a layer thickness of 150 nm was obtained. A PZT-based ferroelectric thin film having a total film thickness of 150 nm was manufactured in the same manner as in Example 1 except the above. Further, in the same thin film of Comparative example 2, there was no film thickness adjusting layer 13, that is, there was no interface 14.

Comparative Example 3

In the orientation controlling layer coating step, the PZT-based ferroelectric composition for the orientation controlling layer having a concentration of 10 mass %, which had been adjusted in the above, was coated under conditions of 500 rpm for 3 seconds and then 3000 rpm for 15 seconds. In the orientation controlling layer calcination step, the drying and calcination conditions were at 350° C. for 5 minutes. The orientation controlling layer coating step and the orientation controlling layer calcination step were repeated three times. Thereby, the orientation controlling layer 12 having a layer thickness of 135 nm was obtained. A PZT-based ferroelectric thin film having a total film thickness of 135 nm was manufactured in the same manner as in Example 1 except the above. Further, in the same thin film of Comparative example 3, there was no film thickness adjusting layer 13, that is, there was no interface 14.

Example 8

In the orientation controlling layer coating step, the PZT-based ferroelectric composition for the orientation controlling layer having a concentration of 12 mass %, which had been adjusted in the above, was coated under conditions of at 500 rpm for 3 seconds and then 2000 rpm for 20 seconds. In the orientation controlling layer calcination step, the drying and calcination conditions were at 350° C. for 5 minutes. The orientation controlling layer coating step and the orientation controlling layer calcination step were carried out only once. Thereby, the orientation controlling layer 12 having a layer thickness of 75 nm was obtained. In the film thickness adjusting layer coating step, the coating conditions were at 500 rpm for 3 seconds and then 3000 rpm for 15 seconds. In the film thickness adjusting layer calcination step, the drying and calcination conditions were at 350° C. for 5 minutes. After the film thickness adjusting layer coating step and the film thickness adjusting layer calcination step were repeated six times, and firing in which the composition was heated at 700° C. for 1 minute at a temperature-rise rate of 10° C./second was carried out so as to crystallize the composition, thereby obtaining a crystal layer having a layer thickness of 270 nm. After a process for manufacturing the crystal layer was repeated 18 times, again, the orientation controlling layer coating step and the orientation controlling layer calcination step were carried out only once, and then firing in which the composition was heated at 700° C. for 1 minute at a temperature-rise rate of 10° C./second was carried out so as to crystallize the composition. Thereby, the film thickness adjusting layer 13 having a layer thickness of 4905 nm was obtained. A PZT-based ferroelectric thin film having a total film thickness of 4980 nm was manufactured in the same manner as in Example 1 except the above.

Example 9

In the orientation controlling layer coating step, the PZT-based ferroelectric composition for the orientation controlling layer having a concentration of 10 mass %, which had been adjusted in the above, was coated under conditions of at 500 rpm for 3 seconds and then 3000 rpm for 15 seconds. In the orientation controlling layer calcination step, the drying and calcination conditions were at 350° C. for 5 minutes. The orientation controlling layer coating step and the orientation controlling layer calcination step were repeated six times. Thereby, the orientation controlling layer 12 having a layer thickness of 270 nm was obtained. In the film thickness adjusting layer coating step, the coating conditions were at 500 rpm for 3 seconds and then 3000 rpm for 15 seconds. In the film thickness adjusting layer calcination step, the drying and calcination conditions were at 350° C. for 5 minutes. After the film thickness adjusting layer coating step and the film thickness adjusting layer calcination step were repeated six times, and firing in which the composition was heated at 700° C. for 1 minute at temperature-rise rate of 10° C./second was carried out so as to crystallize the composition, thereby obtaining a crystal layer having a layer thickness of 270 nm. After a process for manufacturing the crystal layer was repeated 17 times, again, the orientation controlling layer coating step and the orientation controlling layer calcination step were repeated three times, and then firing in which the composition was heated at 700° C. for 1 minute at a temperature-rise rate of 10° C./second was carried out so as to crystallize the composition. Thereby, the film thickness adjusting layer 13 having a layer thickness of 4725 nm was obtained. A PZT-based ferroelectric thin film having a total film thickness of 4995 nm was manufactured in the same manner as in Example 1 except the above.

The PZT-based ferroelectric thin films of Examples 8 and 9 are shown in Table 3 respectively. In addition, a test for comparing the PZT-based ferroelectric thin films is considered as Comparison test 3.

In addition, a dot-shaped Pt thin film (area: $3.5 \times 10^{-2}$ mm$^2$) was formed on the PZT-based ferroelectric thin films obtained in Examples 1 to 9 and Comparative examples 1 to 3 using a sputtering method so as to form a Pt electrode and thus form a plurality of capacitor structures on the same substrate, and then the capacitor structures were again heated at 700° C. in an oxygen atmosphere for 1 minute. For the thin film capacitor obtained in the above manner, the lifetime characteristic was evaluated by carrying out highly accelerated lifetime testing (HALT) in which the thin film capacitor was exposed to a higher load (high temperature and high voltage) environment than conditions ordinarily used. First, the top Pt electrode and the lower Pt electrode on the thin film capacitor were electrically connected. Next, the voltage application durations and the values of leak currents flowing in the respective capacitors were measured while applying a voltage of 14 V in a state in which the thin film capacitors of Examples 1 to 7 and Comparative examples 1 to 3 were heated up to 160° C., and while applying a voltage of 100 V in a state in which the thin film capacitors of Examples 8 and 9 were heated up to 225° C.

As time elapses, an appearance of insulation breakdown occurring due to deterioration of the capacitor and the abruptly increased leak current is confirmed. A duration during which the respective capacitors reached insulation breakdown was read from the measurement data at this time (time-dependent dielectric breakdown (TDDB) evaluation). Specifically, with an assumption that insulation breakdown occur when the leak current value exceeds 100 μA, a statistic calculation using a Weibull distribution analysis was carried

TABLE 3

| | Grain diameter controlling layer Layer thickness (nm) | Orientation controlling layer Layer thickness (nm) | Film thickness adjusting layer Layer thickness (nm) | Preferentially oriented plane | PZT film Grain diameter (nm) | Total film thickness (nm) | MTF (seconds) at 160° C., 14 V | MTF (seconds) at 225° C., 100 V | Dielectric constant |
|---|---|---|---|---|---|---|---|---|---|
| Example 8 | 0 | 75 | 4905 | (111) | 400 | 4980 | — | 3760 | 1544 |
| Example 9 | 0 | 270 | 4725 | (111) | 50 | 4995 | — | 2540 | 1572 |

<Comparison Test>

Tests for comparing the PZT-based ferroelectric thin films of Examples 1 to 9 and Comparative examples 1 to 3 were carried out as follows.

First, the cross-sectional surface of the PZT-based ferroelectric thin film was observed using a SEM (manufactured by Hitachi Science System, Ltd., S-4300SE, resolution 1.5 nm) at an accelerating voltage of 15 kV and a magnification of 10 thousand times to 100 thousand times, the presence of the interface between the orientation controlling layer and the film thickness adjusting layer was confirmed, and the layer thicknesses of the orientation controlling layer and the film thickness adjusting layer and the total film thickness of the PZT-based ferroelectric thin film were measured. In addition, the crystal direction in the preferentially oriented surface of the PZT-based ferroelectric thin film was measured using an X-ray diffraction apparatus (manufactured by Bruker AXS, MXP18VAHF). In addition, the top surface of the PZT-based ferroelectric thin film was photographed using a SEM (manufactured by Hitachi Science System, Ltd., S-4300SE), the crystal grain diameters of 100 arbitrary crystal grains in the photographed SEM image were measured at the maximum unidirectional diameter (Krumbein diameter), and the average was used as the grain diameter of the PZT-based ferroelectric thin film.

out on a plurality of insulation breakdown period data, and the duration in which insulation breakdown occurred in 63.2% of the total number of the capacitors was used as the mean time to failure (hereinafter referred to as the MTF) (refer to paragraphs 0033 to 0038 in Patent Document 3). The reason for using two different heating temperatures and application voltages as above is that the total film thicknesses were 120 nm to 305 nm in Examples 1 to 7 and Comparative examples 1 to 3 (referred to as Group 1), and were 5000 nm or less in Examples 8 and 9 (referred to as Group 2), there was a huge difference in the total film thickness between both groups, and, if the acceleration conditions for Group 2 are not strictly applied to Group 1, the thin film capacitors of Group 2 do not easily reach the breakdown mode, which makes the test meaningless as the acceleration test.

The dielectric constants in the rightmost column in Tables 1 to 3 are initial dielectric constants obtained by evaluating the C-V characteristics (the voltage reliance of the electrostatic capacitance) in a range of −5 V to 5V at a frequency of 1 kHz between the Pt upper electrode and the Pt lower electrode provided on the top surface and the bottom surface of the PZT-based ferroelectric thin film, which were tested in the respective examples and the respective comparative examples, and computing using the maximum value of the electrostatic capacitance. There was no significant and meaningful difference among all dielectric constants. Meanwhile, the C-V characteristics were measured using an LCR meter (manufactured by Hewlett-Packard Company, 4284A) under conditions of bias step 0.1 V, frequency 1 kHz, OSC level 30 mV, delay time 0.2 sec., temperature 23° C., and hygrometry 50±10%.

<Evaluation of Comparison Test 1>

The following evaluation is carried out on Comparison test 1 with reference to Table 1. In Comparison test 1, the total film thickness was set to approximately 300 nm (275 nm to 305 nm), and the PZT films having crystal orientations preferentially controlled in the (111) plane were compared. There is no interface 14 in the PZT film of Comparative example 1.

It was found from MTF values that the PZT films of Examples 1 to 5 having the interface 14 all had a longer lifetime (high lifetime reliability) than the PZT film of Comparative example 1 not having the interface 14. Furthermore, it was found that the lifetime was longer in the PZT films of Examples 1 to 3 having a grain diameter of 200 nm or more than in the PZT films of Examples 4 and 5 having a grain diameter of less than 200 nm.

<Evaluation of Comparison Test 2>

The following evaluation is carried out on Comparison test 2 with reference to Table 2. In Comparison test 2, the total film thickness was set to approximately 135 nm (120 nm to 150 nm), and the PZT films having crystal orientations preferentially controlled in the (111) plane were compared. The total film thicknesses were approximately ½ of those in Comparison test 1, and were relatively thin. There is no interface 14 in Comparative examples 2 and 3.

Similarly to Comparison test 1, in Comparison test 2, it was found from MTF values that the PZT films of Examples 6 and 7 having the interface 14 all had a longer lifetime (high lifetime reliability) than the PZT films of Comparative examples 2 and 3 not having the interface 14. Furthermore, it was found that the lifetime was longer in the PZT film of Example 6 having a grain diameter of 200 nm or more (400 nm) than in the PZT film of Example 7 having a grain diameter of less than 200 nm (50 nm).

<Evaluation of Comparison Test 3>

The following evaluation is carried out on Comparison test 3 with reference to Table 3. In Comparison test 3, the total film thickness was set to approximately 5000 nm or less, and the PZT films having crystal orientations preferentially controlled in the (111) plane were compared. All the PZT films had the interface 14. It was found that the lifetime was longer in the PZT film of Example 8 having a grain diameter of 200 nm or more (400 nm) than in the PZT film of Example 9 having a grain diameter of less than 200 nm (50 nm). Here, the grain diameter of the PZT film of Example 9 decreased to 50 nm. This is because the layer thickness of the orientation controlling layer is as relatively thick as 270 nm.

<General Evaluation>

It was found from the above evaluation results that, according to the PZT-based ferroelectric thin film and the method of manufacturing the same according to the invention, when the orientation controlling layer having a layer thickness, in which the crystal orientation was preferentially controlled in the (111) plane, in a range of 45 nm to 270 nm and the film thickness adjusting layer having the same crystal orientation as the crystal orientation of the orientation controlling layer are provided, and the interface is formed between the orientation controlling layer and the film thickness adjusting layer, it is possible to provide a PZT-based ferroelectric thin film having higher lifetime reliability while having the same dielectric characteristics as a ferroelectric thin film of the related art.

Furthermore, it was found that, when the orientation controlling layer, the film thickness adjusting layer, and the interface are provided, and the grain diameter is decreased to less than 200 nm by forming the orientation controlling layer through the grain diameter controlling layer, it is possible to provide a PZT-based ferroelectric thin film having a fine and uniform crystal structure and high lifetime reliability. On the other hand, it was found that, when the orientation controlling layer, the film thickness adjusting layer and the interface are provided, and the grain diameter becomes 200 nm to 5000 nm, it is possible to provide a PZT-based ferroelectric thin film having higher lifetime reliability.

[Industrial Applicability]

The PZT-based ferroelectric thin film and the method of the same of the invention can be used for an electronic component or an electronic device, such as a thin film capacitor, a capacitor, an IPD, a DRAM memory capacitor, a laminate capacitor, and a piezoelectric element, including a PZT-based ferroelectric thin film which requires higher lifetime reliability.

DESCRIPTION OF REFERENCE NUMERALS AND SIGNS

10 SUBSTRATE
11 LOWER ELECTRODE
12 ORIENTATION CONTROLLING LAYER
13 FILM THICKNESS ADJUSTING LAYER
14 INTERFACE
15 GRAIN DIAMETER CONTROLLING LAYER

The invention claimed is:

1. A PZT-based ferroelectric thin film formed on a lower electrode of a substrate having the lower electrode in which a crystal plane is oriented in a (111) axis direction, comprising:
   an orientation controlling layer which is formed on the lower electrode and has a layer thickness in which a crystal orientation is controlled in a (111) plane preferentially in a range of 45 nm to 270 nm; and
   a film thickness adjusting layer which is formed on the orientation controlling layer and has the same crystal orientation as crystal orientation of the orientation controlling layer,
   wherein an interface is present between the orientation controlling layer and the film thickness adjusting layer.

2. The PZT-based ferroelectric thin film according to claim 1,
   wherein an average value of a maximum unidirectional diameter of crystal grains present in the orientation controlling layer is in a range of 200 nm to 5000 nm.

3. The PZT-based ferroelectric thin film according to claim 2,
   wherein a film thickness of the ferroelectric thin film is in a range of 100 nm to 5000 nm.

4. The PZT-based ferroelectric thin film according to claim 1,
   wherein an average value of a maximum unidirectional diameter of crystal grains present in the orientation controlling layer is in a range of less than 200 nm.

5. The PZT-based ferroelectric thin film according to claim 4,
   wherein the orientation controlling layer is formed on the lower electrode through a grain diameter controlling layer.

6. The PZT-based ferroelectric thin film according to claim 5,
wherein a film thickness of the ferroelectric thin film is in a range of 100 nm to 5000 nm.

7. The PZT-based ferroelectric thin film according to claim 4,
wherein the ferroelectric thin film is for a capacitor, and a film thickness of the ferroelectric thin film is in a range of 100 nm to 500 nm.

8. The PZT-based ferroelectric thin film according to claim 4,
wherein the ferroelectric thin film is for a piezoelectric element, and a film thickness of the ferroelectric thin film is in a range of 1000 nm to 5000 nm.

9. The PZT-based ferroelectric thin film according to claim 4,
wherein a film thickness of the ferroelectric thin film is in a range of 100 nm to 5000 nm.

10. The PZT-based ferroelectric thin film according to claim 1,
wherein a film thickness of the ferroelectric thin film is in a range of 100 nm to 5000 nm.

11. A method of manufacturing a PZT-based ferroelectric thin film on a lower electrode by coating, calcining, and then firing so as to crystallize a PZT-based ferroelectric thin film-forming composition on the lower electrode of a substrate having the lower electrode in which a crystal plane is oriented in a (111) axis direction,
wherein some of the ferroelectric thin film-forming composition is coated, calcined, and fired on the lower electrode so as to form the orientation controlling layer,
a remainder of the ferroelectric thin film-forming composition is coated, calcined, and fired on the orientation controlling layer so as to form a film thickness adjusting layer having the same crystal orientation as a crystal orientation of the orientation controlling layer,
calcination and firing are controlled during formation of the orientation controlling layer so as to have an interface between the orientation controlling layer and the film thickness adjusting layer, and
a coating amount of some of the ferroelectric thin film-forming composition is set so that a layer thickness of the crystallized orientation controlling layer becomes in a range of 45 nm to 270 nm, thereby making crystals in the orientation controlling layer preferentially oriented in a (111) plane.

12. A complex electronic component, such as a thin film capacitor, a capacitor, an IPD, a non-volatile memory, a DRAM memory capacitor, a laminate capacitor, a gate insulating body in a transistor, a pyroelectric infrared detecting element, a piezoelectric element, an electro-optic element, an actuator, a resonate, a ultrasonic motor or an LC noise filter element, having a PZT-based ferroelectric thin film manufactured using the method according to claim 11.

* * * * *